United States Patent

Sugawa

[11] Patent Number: 5,869,851
[45] Date of Patent: Feb. 9, 1999

[54] PHOTOELECTRIC CONVERSION DEVICE WITH GRADED BAND GAP AND CARRIER CONCENTRATION

[75] Inventor: Shigetoshi Sugawa, Atsugi, Japan

[73] Assignee: Canon Kabushiki Kaisha, Tokyo, Japan

[21] Appl. No.: 867,924

[22] Filed: Jun. 3, 1997

Related U.S. Application Data

[63] Continuation of Ser. No. 499,975, Jul. 10, 1995, abandoned, which is a continuation of Ser. No. 61,741, May 17, 1993, abandoned.

[30]  Foreign Application Priority Data

May 27, 1992 [JP] Japan .................................. 4-158889

[51] Int. Cl.⁶ ................. H01L 31/0312; H01L 31/0376; H01L 31/107
[52] U.S. Cl. .............................. 257/186; 257/21; 257/53; 257/55; 257/191
[58] Field of Search ............................ 257/21, 186, 191, 257/55, 56, 53

[56] References Cited

U.S. PATENT DOCUMENTS

| | | | |
|---|---|---|---|
| 4,751,559 | 6/1988 | Sugawa et al. | 357/30 |
| 4,810,896 | 3/1989 | Tanaka et al. | 250/578 |
| 4,814,846 | 3/1989 | Matsumoto et al. | 357/30 |
| 4,866,293 | 9/1989 | Nakamura et al. | 250/578 |
| 4,962,412 | 10/1990 | Shinohara et al. | 357/30 |
| 5,260,560 | 11/1993 | Yamanobe et al. | 257/186 |

FOREIGN PATENT DOCUMENTS

| | | |
|---|---|---|
| 0087299 | 8/1983 | European Pat. Off. . |
| 0437633 | 7/1991 | European Pat. Off. . |
| 9204734 | 3/1992 | European Pat. Off. . |
| 58-157179 | 9/1983 | Japan . |
| 2034977 | 2/1990 | Japan . |
| 0444963 | 4/1991 | WIPO . |

OTHER PUBLICATIONS

Patent Abstracts of Japan, vol. 14, No. 187 (E–917), Apr. 16, 1990.
IEEE Electron Device Letters, vol. EDL–3, Mar. 1992, pp. 71–73.

*Primary Examiner*—Jerome Jackson
*Attorney, Agent, or Firm*—Fitzpatrick, Cella, Harper & Scinto

[57] ABSTRACT

A photoelectric conversion device wherein, in order to realize a photoelectric conversion device with high multiplication factors and excellent response speeds even under the application of low voltage by eliminating spike and notch in the hetero junction, a light absorbing layer (404) and a carrier multiplication layer (403) are made of non-single crystalline materials, said carrier multiplication layer (403) being comprised of a plurality of layers (411 to 414) with the forbidden band width changed continuously, and wherein the difference between the Fermi level and the vacuum energy level of said carrier multiplication layer (403) in the neighborhood of hetero junction is made substantially constant.

17 Claims, 8 Drawing Sheets

FIG. I PRIOR ART
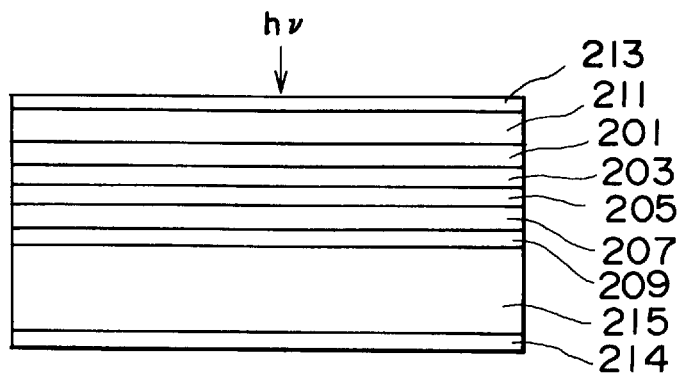
FIG. 2 PRIOR ART
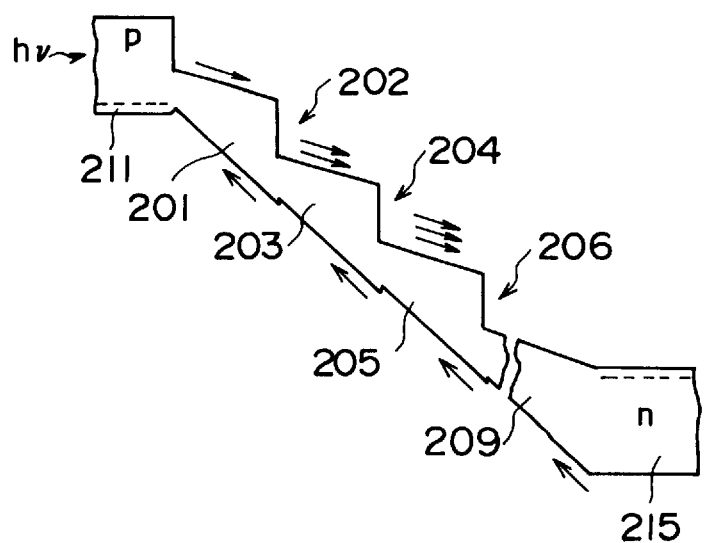

F I G. 10
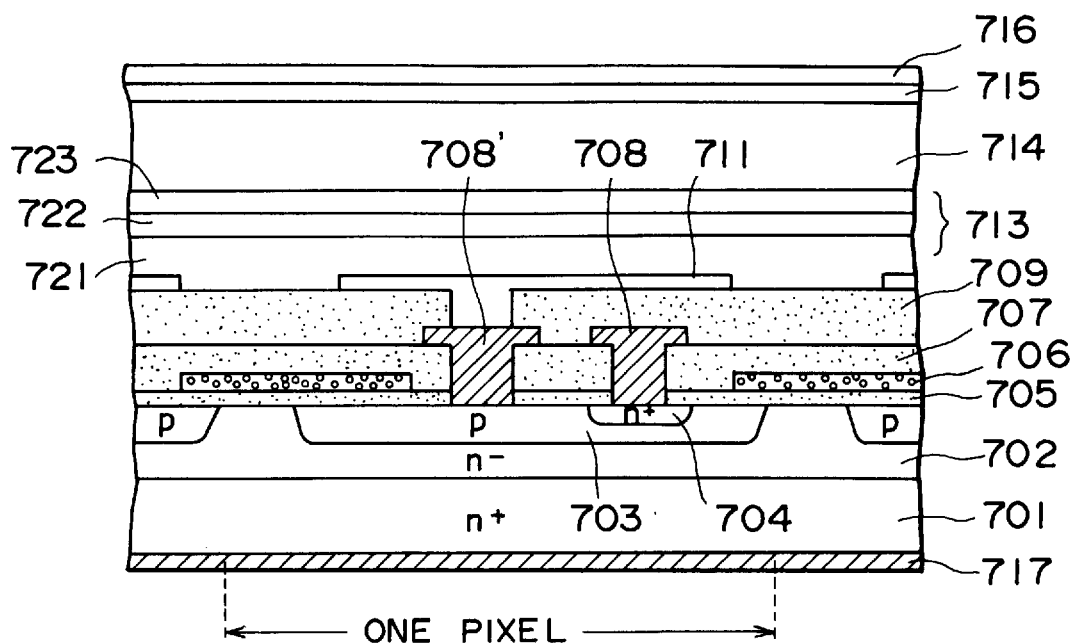
ONE PIXEL
F I G. 11
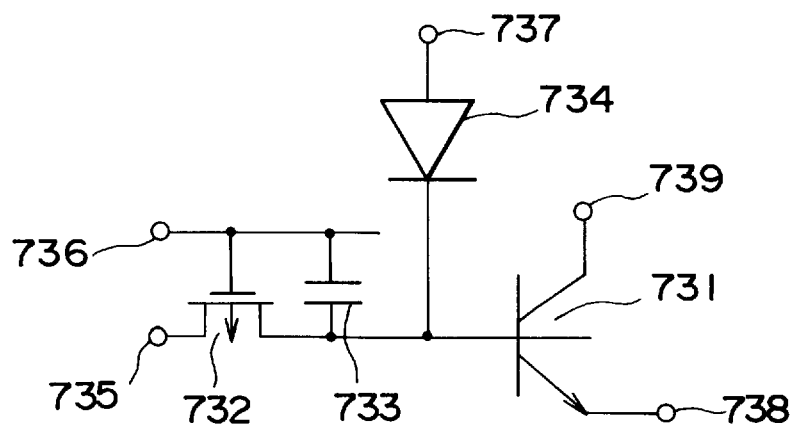

PHOTOELECTRIC CONVERSION DEVICE WITH GRADED BAND GAP AND CARRIER CONCENTRATION

This application is a continuation of application Ser. No. 08/499,975 filed Jul. 10, 1995, now abandoned, which is a continuation of application Ser. No. 08/061,741 filed May 17, 1993, which is now abandoned.

BACKGROUND OF THE INVENTION

1. Field of the Invention

The present invention relates to a photoelectric conversion device, and particularly to a photoelectric conversion device making use of the avalanche multiplication.

2. Related Background Art

Typically, photoelectric conversion devices are required to have a high signal-to-noise ratio for the photoelectric conversion characteristics. In particular, a photoelectric conversion device which uses an avalanche photodiode (hereinafter abbreviated as APD) operated with the avalanche effect in the light receiving portion is expected as it can meet this requirement, and has been developed vigorously in recent years.

Conventionally, generally widespread APDs draw the avalanche effect by applying a strong electric field thereto, in which excessive multiplication noise may occur due to fluctuations contained in the multiplication process, thereby decreasing the signal-to-noise ratio.

In the light of this respect, for example, F. Capasso et al. have proposed a low noise APD applicable to the optical communication system which is fabricated by using single crystal compound semiconductor belonging mainly to the III–V group by molecular beam epitaxy (MBE), in Japanese Patent Application Laid-Open No. 58-157179 and IEEE Electron Device Letters EDL 3rd edition (1982), pp. 71 to 73.

The schematic structural views of a conventional APD which has been proposed therein are illustrated in FIGS. 1 to 3.

FIG. 1 is a cross-sectional structural view of a conventional APD. The I-type band gap graded semiconductor layers 201, 203, 205, 207 and 209, consisting of five layers, acting as the carrier multiplication layer are sandwiched between a P-type semiconductor layer 211 and an N-type semiconductor layer 215, with an electrode 213 being in ohmic contact with the P-type semiconductor layer 211 and an electrode 214 being in ohmic contact with the N-type semiconductor layer 215.

FIG. 2 is an energy band structural diagram when the conventional APD is placed in the operating condition by applying a strong electric field thereto. Herein, since the energy discontinuity of the hetero junctions 202, 204, 206 at which the band gap will steeply step back promotes the ionization, ionization selectively takes place in the neighborhood of the step backs, thereby multiplying carriers.

Such a structure is adopted because it can reduce fluctuation on the sites where ionization takes place, and thus reduce fluctuation contained in the multiplication process. Accordingly, it is possible to realize a low noise APD, which is applicable to the optical communication system, with less excessive noises and an improved signal-to-noise.

However, the conventional APD as above described is effective as a discrete light receiving element for the optical communication which can operate by the application of a strong electric field, but if the conventional APD is used more widely in an application range including photoelectric conversion devices for use with a video camera, a scanner, etc., for performing storage operation, the following problems have often occured.

(1) As the conventional APD is made of a compound semiconductor belonging to the III–V group and the II–VI group as its constituting material, it has some problems with the industrial material concerning the toxicity or price of material.

(2) As in forming a single crystal compound semiconductor as the constituting material thereof, film formation is necessary to be made at high temperatures (about 500° C. or higher) using a ultra-high vacuum equipment, it is difficult to apply it to the photoelectric conversion device of large area, and impossible to laminate it on a semiconductor substrate on which a signal processing circuit is already formed, resulting in the limited application range.

(3) In order to realize a low noise APD, it is necessary to raise the ionization rate at step back hetero junctions, for which a material in which either one of valence band and conduction band is only large on the energy discontinuity at the step back junctions is required, but there are only a limited number of materials meeting such a requirement in the crystal compound semiconductor. Furthermore, in order to realize a much lower noise APD with thermally arising dark current constituting a factor of noise suppressed, it is necessary to meet the above-cited requirement as well by using a material having a large minimum forbidden band width (desirably greater than 1.0 eV), but there is no material meeting such requirement in the crystal compound semiconductor.

(4) Furthermore, when performing the storage operation, the electric field to be applied to APD will decrease with increasing carrier storage amount, so that spike and notch may arise at the step back hetero junctions of the carrier multiplication layer constituted of the I-type semiconductor, as shown in FIG. 3. Therefore, the effective band discontinuity at the step back hetero junctions will degrade, causing a decrease in ionization rate and a discontinuity in energy band in the direction of impeding the carrier transit, thereby resulting in smaller multiplication factor, proper linearity in incident light quantity to output, and lower response speed.

SUMMARY OF THE INVENTION

The present invention is to resolve the above-mentioned problems, and its objective is to provide a photoelectric conversion device effective in the extensive range of applications, wherein even when a low voltage is applied, it has a high multiplication factor and an excellent response speed, is useful in the industrial field, and can be laminated onto a circuit existing semiconductor substrate, by eliminating the spike and notch at the hetero junctions.

Also, it is another objective of the present invention to provide a photoelectric conversion device comprising a light absorbing layer and a carrier multiplication layer made of non-single crystal material, said carrier multiplication layer comprised of a plurality of layers with the forbidden band width varied continuously, wherein the difference between the Fermi level and the vacuum energy level of said carrier multiplication layer in the neighborhood of a hetero junction is substantially constant.

BRIEF DESCRIPTION OF THE DRAWINGS

FIG. 1 is a cross-sectional structural view for explaining an example of a conventional APD.

FIG. 2 is a typical energy band structural diagram when the conventional APD is placed in the operating condition by applying a strong electric field thereto.

FIG. 10 is a schematic cross-sectional view around a light receiving portion in another embodiment of the present invention.

FIG. 11 is a one-pixel equivalent circuit diagram of another embodiment of the present invention.

DETAILED DESCRIPTION OF THE PREFERRED EMBODIMENTS

The preferred embodiments and the effects of a photoelectric conversion device according to the present invention will be described below with reference to FIGS. 4 to 6.

Figure 3:
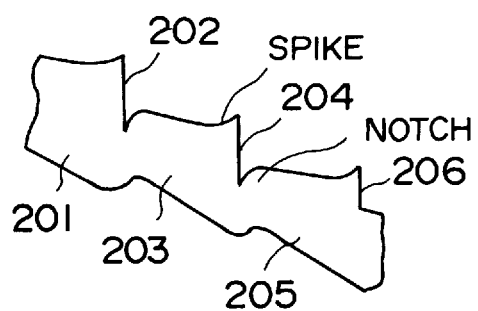
FIG. 3 is a typical energy band structural diagram at the step band hetero junctions of carrier multiplication layer when the storage operation is performed with the conventional APD.
Figure 4:
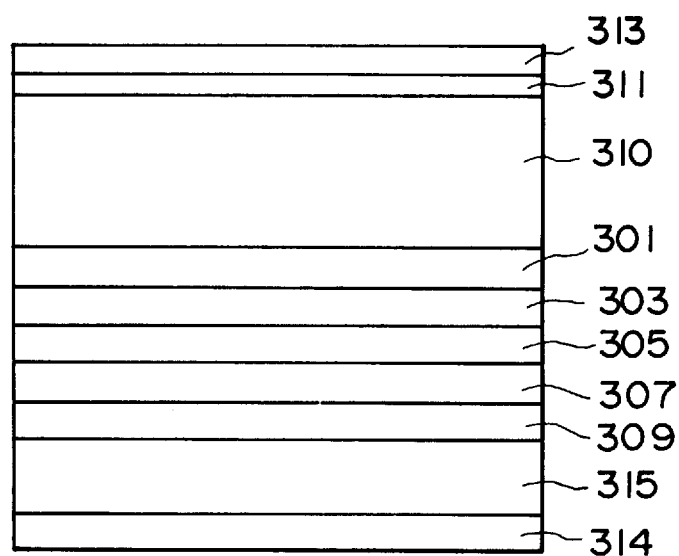
FIG. 4 is a schematic cross-sectional structural view showing the structure of an embodiment of a photoelectric conversion device according to the present invention.

FIG. 4 is a schematic cross-sectional view showing one embodiment of the structure of a photoelectric conversion device according to the present invention, wherein a light absorbing layer 310 and a plurality of forbidden band width graded layers 301, 303, 305, 307 and 309 acting as the carrier multiplication layer are sandwiched between a P-type semiconductor layer 311 and an N-type semiconductor layer 315 which are charge injection blocking layers, with the P-type semiconductor layer 311 being electrically connected to an electrode 313, and the N-type semiconductor layer 315 being electrically connected to an electrode 314. It should be noted that the carrier injection blocking layers may be Schottky joined to adjacent semiconductor layers. Also, the forbidden band width graded layers were shown in the case of five layers, but not limitative thereto, it is necessary that they consist of one or two layers or more.

Figure 5:
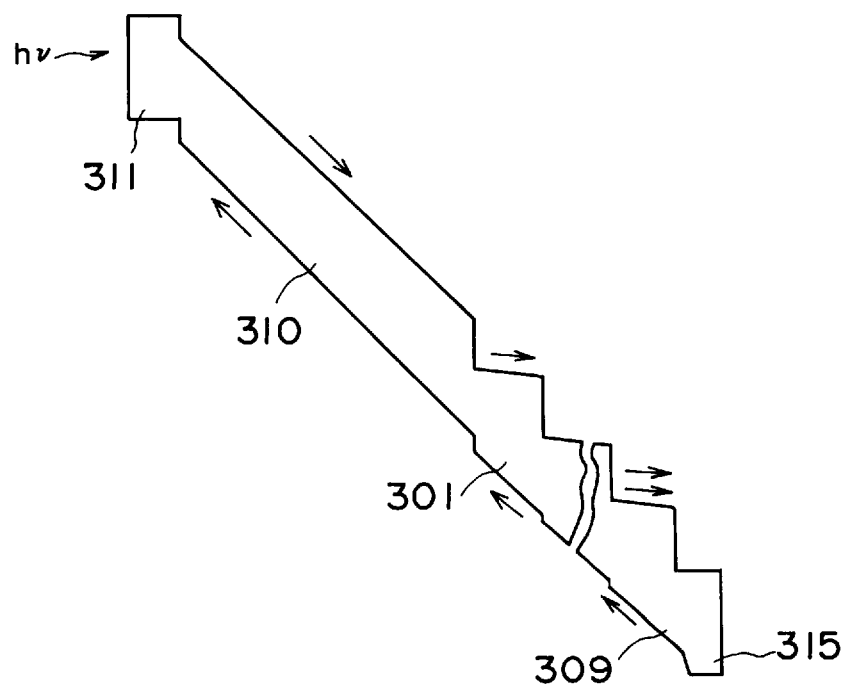
FIG. 5 is a typical energy band diagram of an embodiment of a photoelectric conversion device according to the present invention when a high electric field is applied.
Figure 6:
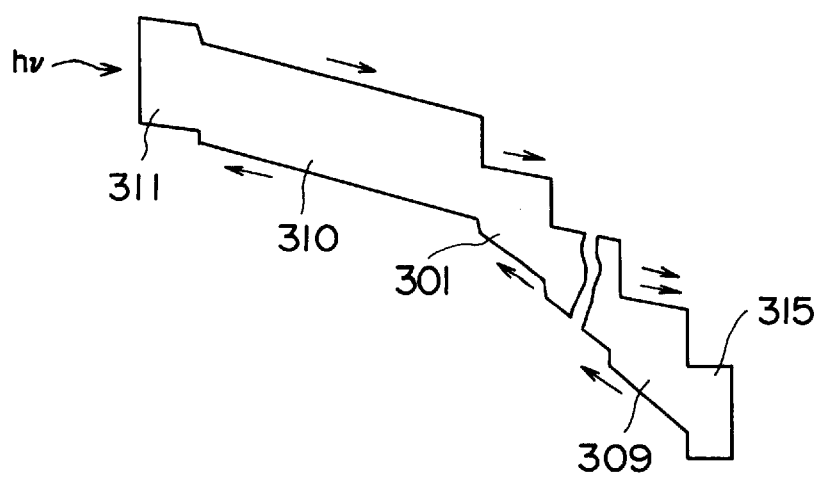
FIG. 6 is a typical energy band diagram of an embodiment of a photoelectric conversion device according to the present invention when a low electric field is applied.

FIG. 5 is a typical energy band diagram of a photoelectric conversion device of the present invention when a high electric field is applied thereto, and FIG. 6 is a typical energy band diagram of the photoelectric conversion device of the present invention when a low electric field is applied.

A multiplication principle relying on the avalanche effect is apparently similar to a conventional one as proposed by F. Capasso et al., except that the photoelectric conversion device of the present invention operates as follows.

(1) The light absorbing layer and the carrier multiplication layer of the photoelectric conversion device according to the present invention, which are made of non-single crystalline materials, are less toxic, inexpensive and favorable in the industrial field. Herein, the non-single crystalline material is a polycrystalline material or amorphous material, the amorphous material including a so-called crystalline material. Specifically, examples thereof include polycrystalline silicone, amorphous silicone including hydrogen and/or halogen element (hereinafter referred to as a-Si(:H,X)), amorphous silicone germanium (hereinafter referred to as a-SiGe(:H,X)), amorphous silicone carbide (hereinafter referred to as a-SiC(:H,X)), and crystalline silicone.

(2) In the formation of non-single crystalline material which is a material making up the photoelectric conversion device of the invention, a film formation method such as plasma CVD method of sputtering method can be used, which enables easy film formation in large area and at low temperatures (200° to 300° C.). Accordingly, the photoelectric conversion device of the invention is easily applied in large area, and can be laminated on a semiconductor substrate on which a signal processing circuit is already formed, so that its application range is widely extended.

(3) By the use of non-single crystalline material, it is possible to form a carrier amplification layer in which the minimum forbidden band width is large (for example, above 1.0 eV) and only one of the valence band side or conduction band side of energy discontinuity of step back hetero junctions is large. Accordingly, the multiplication operation at high efficiencies can be realized with small quantities of excessive noise and dark current noise.

(4) Furthermore, even if the electric field to be applied to the carrier multiplication layer decreases with the increase in the amount of carriers stored by the storage operation, no spike or notch occurs at the step back hetero junctions of the carrier multiplication layer, as shown in FIG. 6. Accordingly, the band discontinuity at the step back hetero junctions can be maintained even at low electric field, a high ionization rate equivalent to that when high electric field is applied can be not only accomplished, but also no energy discontinuity in the direction of impeding the carrier transit occurs, so that it is possible to effect the storage operation, with high multiplication factors and excellent linearity in the incident light quantity to output, and at high response speeds. The amount of energy discontinuity not impeding any transit of carriers is preferably 0.2 eV or less at ordinary temperatures, and more preferably 0.1 eV or less.

Accordingly, in accordance with the above-described constitution of the present invention, the light absorbing layer and the carrier multiplication layer are made of non-single crystalline semiconductor material, and by doping impurities into the carrier multiplication layer, the difference between the Fermi level and the vacuum energy level of the carrier multiplication layer, particularly in the neighborhood of hetero junction is made substantially constant, so that any spike and notch of the hetero junction can be eliminated, whereby it is possible to realize a photoelectric conversion device which has high multiplication factors and excellent response speeds, is effective in the industrial field, and can be laminated on the circuit existing semiconductor substrate, without degrading any performance under the storage operation.

The preferred embodiments of the present invention will be described below in detail with reference to the drawings.

Figure 7:
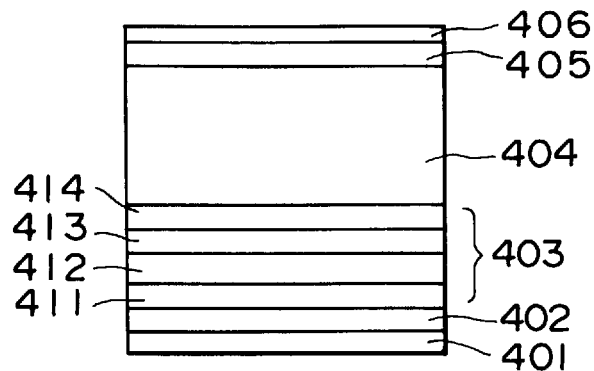
FIG. 7 is a schematic cross-sectional view showing an embodiment of a photoelectric conversion device according to the present invention.

FIG. 7 is a schematic cross-sectional view showing the structure of one embodiment of a photoelectric conversion device according to the present invention.

In FIG. 7, 401 is a Cr electrode, 402 is a charge injection blocking layer made of an N-type a-$Si_{1-x}Ge_x$:H having a thickness of about 500 Å for blocking injection of holes, 403 is a carrier multiplication layer for making carrier multiplication in which the forbidden band width is changed by changing the composition from a-$Si_{1-x}Ge_x$:H to a-$Si_{1-y}C_y$:H, 404 is a light absorbing layer made of a-Si:H having a thickness of about 1 μm for absorbing the light and producing carriers, 405 is a charge injection blocking layer made of a P-type a-$Si_{1-y'}C_{y'}$:H having a thickness of about 100 Å for blocking injection of electrons, and 406 is a transparent electrode principally made of indium oxide.

The Cr electrode 401 was created by EB vapor deposition, the transparent electrode 406 was created by sputtering, and the charge injection blocking layer 405, the light absorbing layer 404, the carrier multiplication layer 403 and the charge injection blocking layer 402 were created by plasma CVD. Source gases used for creating the amorphous layer were $SiH_4$, $GeH_4$, $PH_3$, $H_2$ for the charge injection blocking layer 402, $SiH_4$, $GeH_4$, $CH_4$, $B_2H_6$, $H_2$ for the charge multiplication layer 403, $SiH_4$, $H_2$ for the light absorbing layer 404, and $SiH_4$, $CH_4$, $B_2H_6$, $H_2$ for the charge injection blocking layer 405.

There is shown below an example in which the carrier multiplication layer 403 is comprised of four layers of forbidden band width and Fermi level varying layers 411, 412, 413, 414 having a thickness of 200 Å which were formed by changing continuously the gas flow rates of $CH_4$, $GeH_4$, $B_2H_6$ among the source gases of the carrier multiplication layer 403. A forbidden band width varying region of the carrier multiplication layer was created by first starting with the formation of a maximum forbidden band width layer from the gases of $SiH_4$, $H_2$, $CH_4$, $B_2H_6$, gradually decreasing the flow of $CH_4$ to zero, and then gradually increasing the flow of $GeH_4$ to reach the maximum forbidden band width layer. Also, at this time, the flow of $B_2H_6$ is changed in such a way as to gradually decrease from the maximum forbidden band width layer to reach zero in the minimum forbidden band width layer.

Figure 8:
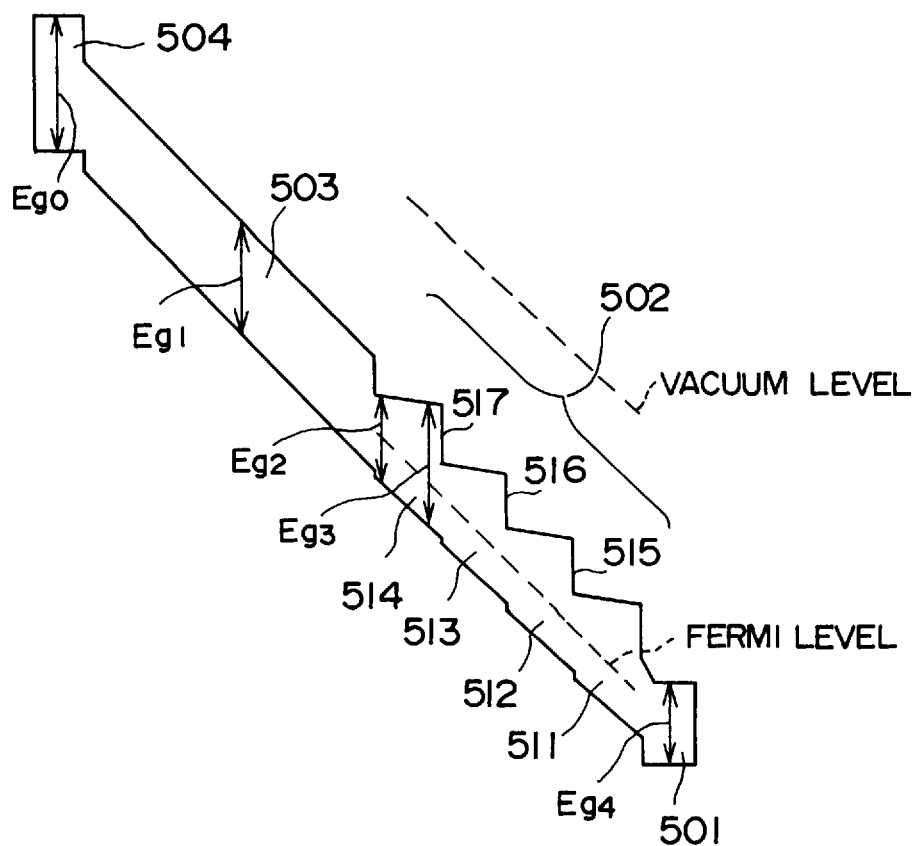
FIG. 8 is a typical energy band diagram when a strong electric field is applied to this photoelectric conversion device.
Figure 9:
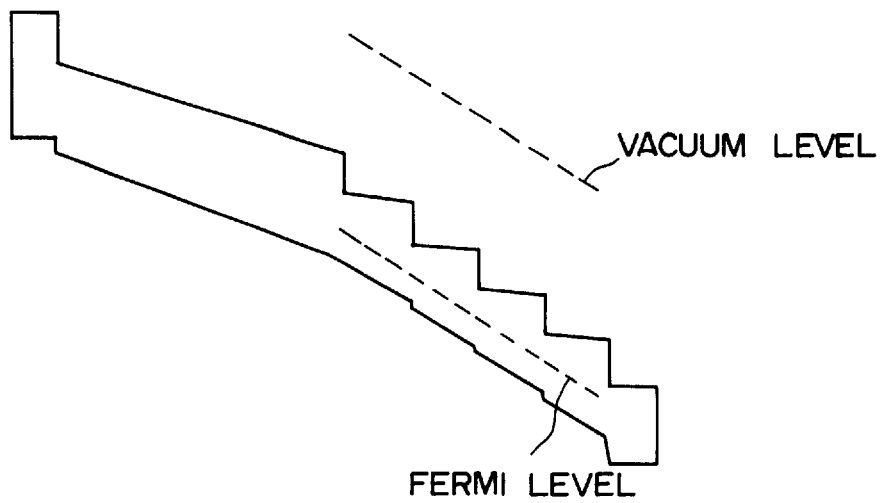
FIG. 9 is a typical energy band diagram when a weak electric field is applied to this photoelectric conversion device.

The energy band structure of a photoelectric conversion device in an embodiment of FIG. 7 is shown in FIGS. 8 and 9. FIG. 8 is an energy band diagram when a strong electric field is applied to the photoelectric conversion device, and FIG. 9 is an energy band diagram when a weak electric field is applied to the photoelectric conversion device.

FIGS. 8 and 9 show that the forbidden band width of an N-type a-$Si_{1-x}Ge_x$:H layer 501 is Eg4, the minimum forbidden band width of the carrier multiplication layer consisting of four layers of forbidden band width varying layers 511, 512, 513, 514 with the composition changed from a-$Si_{1-x}Ge_x$:H to a-$Si_{1-y}C_y$:H is Eg2, the maximum forbidden band width is Eg3, the forbidden band width of a-Si:H layer 503 is Eg1, and the forbidden band width of P-type a-$Si_{1-y'}C_{y'}$:H layer 504 is Eg0. Also, it is shown that 515, 516 and 517 are step back hetero junctions. The forbidden band width Eg1 of the a-Si:H layer 503 created herein is as large as sbout 1.72 eV. The composition ratio y' of C in the a-$Si_{1-y'}C_{y'}$:H layer 504 is about 0.2, with its forbidden band width of about 2.2 eV. The composition ratio y of the layer a-$Si_{1-y}C_y$ providing the maximum forbidden band width in the forbidden band width varying layers 511, 512, 513, 514 is about 0.5, with its forbidden band width of about 2.9 eV. Also, the composition ratios x of Ge in the a-$Si_{1-x}Ge_x$:H layer 501 and the layer a-$Si_{1-x}Ge_x$:H providing the minimum forbidden band width in the forbidden band width varying layers 511, 512, 513, 514 are both about 0.4, with the forbidden band widths Eg4 and Eg2 being both about 1.4 eV. The B density of the forbidden band width varying layer is maximum at the maximum forbidden band width layer, gradually decreasing therefrom to reach zero at the minimum forbidden band width layer. At this time, the Fermi level of the forbidden band width varying layers 511, 512, 513, 514 is located about 0.4 eV below from the center of the forbidden band in the maximum forbidden band width layer, gradually changing therefrom, and located at the center of the forbidden band in the minimum forbidden band width layer. At this time, the Fermi level in the neighborhood of the step back hetero junction is substantially constant in a range of about 0.1 eV wide from the vacuum level.

As can be seen from FIGS. 8 and 9, there occur no spike and notch under the application of strong electric field as well as weak electric field in this embodiment.

The multiplication factor of the photoelectric conversion device in this embodiment was substantially constant, or about 10 times, when a bias of 10 V to 20 V was applied. Excessive noise produced with the multiplication was as low as about 1.05. Also, the dark current was as low as about 1 nA/$cm^2$ or less. The response speed was as fast as that of a pin-type photoelectric conversion device without carrier multiplication layer.

In this embodiment there were four forbidden band varying layers within the carrier multiplication layer, but this is merely one example, and the number of layers may be arbitrary, and can be determined in accordance with a desired multiplication factor.

Also, in this embodiment, the step back hetero junction was steep, but the same effects can be obtained as well in a range within the mean free path of electron, even if the junction is gentle. Even if the junction is gentler, the step back hetero junction may be satisfied in a range of bringing about the desired action.

Also, in this embodiment the thickness of composition varying layer is about 200 Å, but may be in a range of thickness in which carriers can transit without recombination. It should be noted that a thinner layer is more preferable because the applied bias can be lowered. Also, in this embodiment, the thickness of the light absorbing layer is about 1 μm, but may be in a range of thickness in which the incident light does not penetrate through the light receiving layer to reach the carrier multiplication layer, this thickness being determined depending on the incident light absorbing coefficient.

As the source gases for the amorphous layer, $SiH_4$, $B_2H_6$, $PH_3$, $CH_4$, $GeH_4$ were used in this embodiment, but instead of $SiH_4$, the chain silane compounds such as $SiF_4$, $Si_2H_6$, $Si_2F_6$, $Si_3H_8$, $SiH_3F$, $Si_2F_2$, and the cyclic silane compounds such as $Si_4H_8$, $Si_5H_{10}$, $Si_6H_{12}$ can be used; instead of $B_2H_6$, the gases including III-group atoms such as B, Al, In, Ti can be used; instead of $PH_3$, the gases including V-group atoms such as P, As, Sb, Bi can be used, including the carbon compounds such as $CH_4$, $CH_2F_2$, $C_2H_6$, $C_2H_4$, $C_2H_2$, $Si(CH_3)_4$, $SiH(CH_3)_3$, the nitrogen compounds such as $N_2$, $NH_3$, $H_2NNH_2$, $HN_3NH_4N_3$, $F_3N$, $F_4N$, and the oxygen compounds such as $O_2$, $CO_2$, NO, $NO_2$, $N_2O$, $O_3$, $N_2O_3$, $N_2O_4$, $NO_3$; and instead of $GeH_4$, the germanium compound such as $GeF_4$ and the tin compound such as $SnH_4$ can be used. Furthermore, the composition ratio x or y in the forbidden band width varying layer is preferably in a range from 0 to about 0.6 in order to decrease the local level. For the fabrication of amorphous layer, in addition to the plasma. CVD method, the ECR plasma method is effective.

In this embodiment, the amorphous layer was used for the semiconductor layer, but the non-single crystal such as polycrystal may be used.

Also, in this embodiment, light is incident from the P layer side of the charge injection blocking layer to effect the multiplication operation with electrons, but it will be appreciated that light may be incident from the N side of the charge injection blocking layer to effect the multiplication operation with holes in such as way as to form steep step back hetero junction on the valence band side of the carrier multiplication layer by exchanging the P layer and the N layer of the charge injection blocking layer.

The forbidden band width of charge injection blocking layer and the doping amount may be adjusted so that the injection of minority carriers from the electrode be suppressed and the transit property of majority carriers not be prevented.

An example will be described below in which the photoelectric conversion device of the above embodiment is laminated on a scan circuit and a read circuit, as already proposed in Japanese Patent Application Laid-Open No. 63-278269 by the present inventors.

Figure 12:
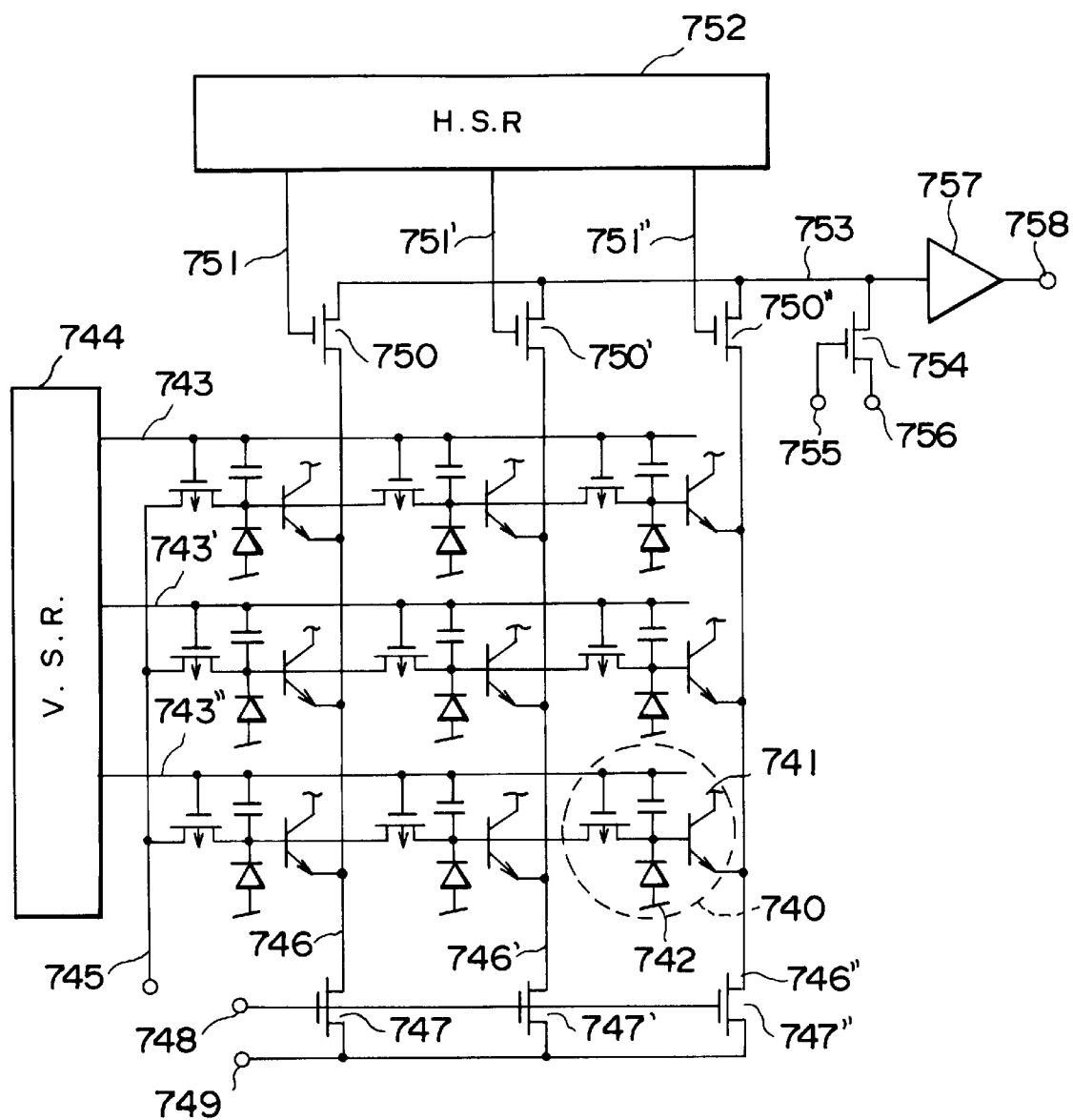
FIG. 12 is an equivalent circuit diagram of the whole device in another embodiment of the present invention.

FIG. 10 is a schematic cross-sectional view around the light receiving portion in this example of the present invention, FIG. 11 is an equivalent circuit diagram of one pixel, and FIG. 12 is an equivalent circuit and block diagram of the whole device.

In FIG. 10, an N_ layer 702 useful as the collector region is formed on an N-type silicone substrate 701 by epitaxial growth, and a P base region 703 and an N_+ emitter region 704 are further formed within it, so that a bipolar transistor is constituted. The P base region 703 is separated apart from adjacent pixels, and a gate electrode 706 is formed, with an oxide film 705 interposed between adjacent P base regions extending in the horizontal direction. Accordingly, a P channel MOS transistor is constituted with adjacent P base regions 703 made respectively as the source and drain regions. The gate electrode 706 also acts as a capacitor for controlling the voltage of the P base region 703. Further, after forming an insulation layer 707, an emitter electrode 708 and a base electrode 708' are formed. Thereafter, an insulation layer 709 is formed, and then an electrode 711 is formed, so that each pixel is separated. The electrode 711 is electrically connected to the electrode 708'. Subsequently, a carrier multiplication layer 713 is constituted by forming the forbidden band width varying layers 721, 722, 723, 724 of a-$Si_{1-x}Ge_x$:H to a-$Si_{1-y}C_y$:H. Then, a light absorbing layer a-Si:H layer 714, a P-type a-$Si_{1-y}C_y$:H layer 715 and a transparent electrode 716 for applying the bias are formed. A collector electrode 717 is disposed in ohmic contact therewith on the back side of the substrate 701.

Accordingly, an equivalent circuit of one pixel is as shown in FIG. 11, in which a P channel MOS transistor 732, a capacitor 733 and a photoelectric conversion device 734 as in the previous example are connected to the base of a bipolar transistor 731, and a terminal 735 for supplying the voltage to the base, a terminal 736 for driving the P channel MOS transistor 732 and the capacitor, an electrode 737 for supplying the voltage to the transparent electrode, an emitter electrode 738 and a collector electrode 739 are provided.

FIG. 12 is a circuit configuration diagram in which one-pixel cells 740 as shown in FIG. 11 are arranged in a two dimensional matrix of 3×3. In the same figure, a collector electrode 741 of one-pixel cell 740 is provided in each of all pixels, and a sensor electrode 742 is also provided. Also, a gate electrode and a capacitor electrode of the PMOS transistor are connected to respective one of the drive lines 743, 743', 743" for each row leading to a vertical shift register (V. S. R.) 744. Also, an emitter electrode is connected to respective one of the vertical lines 746, 746', 746" for reading signals for each column. The vertical lines 746, 746', 746" are connected respectively to the reset switches 747, 747', 747" for resetting the charge of the vertical lines and the read switches 750, 750', 750". The gate electrode of the reset switches 747, 747', 747" are commonly connected to a terminal 748 for applying vertical line reset pulses, and the sources electrode thereof are commonly connected to a terminal 749 for applying the vertical line reset voltage. The gate electrode of the read switches 750, 750', 750" is connected via the lines 751, 751', 751" to a horizontal shift register (H. S. R.) 752, and the drain electrode thereof is connected via a horizontal read line 753 to an output amplifier 757. The horizontal read line 753 is connected to a switch 754 for resetting the charge of the horizontal read line. A reset switch 754 is connected to a terminal 755 for applying the horizontal line reset pulse and a terminal 756 for applying the horizontal line reset voltage. Finally, the output of the amplifier 757 is led out of a terminal 758.

Reffering now to FIGS. 10 to 12, the operation will be described briefly. The incident light is absorbed by the light absorbing layer 714 as shown in FIG. 10, and produced carriers are amplified in the multiplication region 713 and stored in the base region 703. If a drive pulse output from the vertical shift register of FIG. 12 appears in the drive line 743, the base voltage will rise up via the capacitor, so that signal charge corresponding to the light quantity, beginning with the pixel on the first row, are passed into the vertical lines 746, 746', 746". Then, if scan pulses from the horizontal shift register 752 are sequentially output into the lines 751, 751', 751", the read switches 750, 750', 750" are controlled in sequence to turn on or off, so that the signal is led out of the output terminal 758 through the amplifier 757. In doing this, the reset switch 754 is turned on while the switches 750, 750', 750" are turned on in sequence, so that residual charges on the horizontal line 753 are removed. Then, the vertical line reset switches 747, 747', 747" are turned on, so that residual charges on the vertical lines 746, 746', 746" are removed. And if a pulse in the negative direction is applied from the vertical shift register 744 to the drive line 743, each PMOS transistor on the first row is turned on, so that base residual charges of each pixel are removed and the initialization is effected. Then, a drive pulse output from the vertical shift register 744 appears on the drive line 743', so that signal charges at the second row are similarly taken out. And then signal charges on the third row are similarly taken out. By repeating the above operation, this device can be operated.

While in the embodiment as described above a circuit example according to the invention made by the present inventors was described, it will be appreciated that this device may be applied to a circuit of a photoelectric conversion device as generally well known.

Figure 13:
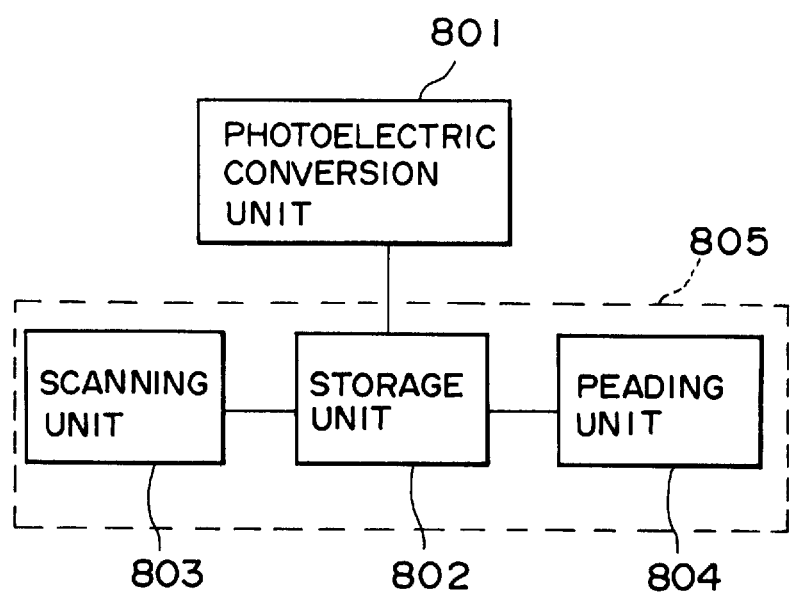
FIG. 13 is a block diagram for explaining one constitutional example of a photoelectric conversion device to which the present invention is applicable.

A photoelectric conversion device according to the present invention, which is used as the photoelectric conversion device of the typical constitution, will be described below. FIG. 13 is a block diagram showing a constitution in which the present invention is applied to a photoelectric conversion device of the typical constitution. In the same figure, 801 is a photoelectric conversion unit according to the invention, for which a photoelectric conversion device of the present invention, for example, as shown above, can be used. The photoelectric conversion unit 801 is connected to a signal output unit 805. In the signal output unit 805, 802 is a storage unit for storing signal charges produced by the photoelectric conversion unit 801, 803 is a scanning unit for driving the storage unit 802, and 804 is a reading unit consisting of a circuit for effecting the multiplication and the noise compensation of signal charges transferred by the scanning unit 803. Note that the storage unit 802 is necessary to effect storage operation, but may be omitted if the storage operation is not performed.

The present invention, as above described, is a photoelectric conversion device comprising a light absorbing layer and a carrier multiplication layer made of non-single crystalline materials, the carrier multiplication layer being comprised of a plurality of layers with the forbidden band width thereof changed continuously, arranged one above the other, wherein by doping impurities into the carrier multiplication layer, the difference between the Fermi level and the vacuum energy level of the carrier multiplication layer, particularly in the neighborhood of hetero junction is substantially constant, so that any spike and notch in the hetero junction are eliminated, whereby the photoelectric conversion device has high multiplication factors and excellent response speeds even under the application of low voltages, and is effective industrially and capable of being laminated onto a circuit existing semiconductor substrate.

What is claimed is:

1. A photoelectric conversion device comprising:
   a light absorbing region, made of non-monocrystalline material, for generating carriers in response to incident light; and
   a carrier multiplication region, made of non-monocrystalline material, said carrier multiplication region having opposed top and bottom sides spaced apart in a thickness direction of said carrier multiplication region, said carrier multiplication region being joined to said light absorbing region at said top side of said carrier multiplication region,
   wherein said carrier multiplication region comprises plural laminated layers, each said layer having respective opposed top and bottom sides spaced apart in said thickness direction, and each said layer, except for a top one of said layers adjacent to said light absorbing region, having its top side laminated to the bottom side of an adjacent one of said layers to form a respective heterojunction therebetween,
   wherein each said layer, when an electric field is applied to said device, has an energy band gap that increases gradually and continuously in a thickness direction away from said light absorbing region, each said layer being doped with a Group III element as an impurity, an impurity concentration in each said layer increasing gradually in the same direction as the increasing energy band gap so that the impurity concentration has a maximum value at a maximum energy band gap side and has a minimum value at a minimum energy band gap side, and a difference between a Fermi level and a vacuum energy level in the vicinity of each of the respective heterojunctions of said carrier multiplication region is substantially constant within in a range of 0.2 eV so that substantially no spikes and notches are formed in a valence band or a conduction band at the respective heterojunctions.

2. The photoelectric conversion device according to claim 1, characterized in that said non-monocrystalline material contains at least silicon atoms.

3. The photoelectric conversion device according to claim 1, characterized in that said difference is held to be no more than 0.2 eV by doping impurities into said carrier multiplication region.

4. The photoelectric conversion device according to claim 1, wherein the plural layers are selected from amorphous or polycrystalline material.

5. The photoelectric conversion device according to claim 1, wherein the plural layers have a region represented as $Si_{1-x}Ge_x$ or $Si_{1-y}C_y$.

6. The photoelectric conversion device according to claim 5, wherein said x and y is changed in a range from 0 to 0.6.

7. The photoelectric conversion device according to claim 5, wherein said $Si_{1-x}Ge_x$ or $Si_{1-y}C_y$ contains hydrogen atoms.

8. The photoelectric conversion device according to claim 1, wherein said light absorbing region is formed of amorphous silicon.

9. The photoelectric conversion device according to claim 8, wherein said light absorbing region contains hydrogen atoms.

10. A device according to claim 1, wherein the Group III element is boron.

11. The photoelectric conversion device according to claim 1, wherein a first charge injection blocking layer is provided on one side of said light absorbing region opposite said carrier multiplication region, and a second charge injection blocking layer is provided on said bottom side of said carrier multiplication region opposite said light absorbing region.

12. The photoelectric conversion device according to claim 11, wherein said first charge injection blocking layer is formed of a material expressed as $Si_{1-y'}C_{y'}$.

13. The photoelectric conversion device according to claim 12, wherein said first charge injection blocking layer further contains hydrogen.

14. The photoelectric conversion device according to claim 11, wherein said second charge injection blocking layer is formed of a material expressed as $Si_{1-x}Ge_x$.

15. The photoelectric conversion device according to claim 14, wherein said second charge injection blocking layer further contains hydrogen atoms.

16. The photoelectric conversion device according to claim 11, wherein said first charge injection blocking layer is formed of a material expressed as $Si_{1-y'}C_{y'}$, said second charge injection blocking layer is formed of a material expressed as $Si_{1-x}Ge_x$, said carrier multiplication region being formed of a material expressed of $Si_{1-y}C_y$ on the side of said first charge injection blocking layer, and formed of a material expressed as $Si_{1-x}Ge_x$ on the side of said second charge injection blocking layer.

17. The photoelectric conversion device according to claim 1, characterized in that there are provided a plurality of said photoelectric conversion devices, and a signal output unit electrically connected to said photoelectric conversion devices comprises at least one of a storage unit for storing electrical signals produced by said photoelectric conversion devices, a scanning unit for scanning said electrical signals, and a reading unit for reading said electrical signals.

* * * * *

UNITED STATES PATENT AND TRADEMARK OFFICE
CERTIFICATE OF CORRECTION

PATENT NO. : 5,869,851

DATED : February 9, 1999

INVENTOR(S) : SHIGETOSHI SUGAWA

Page 1 of 2

It is certified that error appears in the above-identified patent and that said Letters Patent is hereby corrected as shown below:

<u>IN THE DRAWINGS</u>

Sheet 8, FIG. 13, "PEADING" should read --READING--.

<u>COLUMN 2</u>

Line 13, "a ultra-high" should read --an ultra-high--.

<u>COLUMN 3</u>

Line 56, "Also, the" should read --Also, as the--.

<u>COLUMN 4</u>

Line 19, "of" should read --or--.

<u>COLUMN 5</u>

Line 13, "a-$Si_{1-y}$'$C_y$':H" should read --a-$Si_{1-y'}C_{y'}$:H--; and
Line 60, "sbout" should read --about--.

<u>COLUMN 7</u>

Line 11, "such as way" should read --such a way--;
Line 30, "$N_-$" should read --$N^-$--; and
Line 32, "$N_+$" should read --$N^+$--.

<u>COLUMN 8</u>

Line 10, "electrode" should read --electrodes--;
Line 13, "sources electrode" should read --source electrodes--; and
Line 58, "as" should read --as is--.

UNITED STATES PATENT AND TRADEMARK OFFICE
CERTIFICATE OF CORRECTION

PATENT NO. : 5,869,851
DATED : February 9, 1999
INVENTOR(S) : SHIGETOSHI SUGAWA

It is certified that error appears in the above-identified patent and that said Letters Patent is hereby corrected as shown below:

COLUMN 9

Line 61, 'in" should be deleted.

COLUMN 10

Line 36, "$Si_{i-y}`C_y`.$" should read --$Si_{i-y'}C_{y'}..$--

Signed and Sealed this

Thirtieth Day of November, 1999

Attest:

Q. TODD DICKINSON

Attesting Officer

Acting Commissioner of Patents and Trademarks